United States Patent
Lee et al.

(10) Patent No.: US 12,451,370 B2
(45) Date of Patent: Oct. 21, 2025

(54) SUBSTRATE PROCESSING SYSTEM WITH VERTICAL ARRANGEMENT STRUCTURE

(71) Applicant: KCTECH CO., LTD., Gyeonggi-do (KR)

(72) Inventors: Dong Hwa Lee, Gyeonggi-do (KR); Hyung Chul Kim, Gyeonggi-do (KR); You Sun Jung, Busan (KR)

(73) Assignee: KCTECH Co., Ltd., Anseong-si (KR)

( * ) Notice: Subject to any disclaimer, the term of this patent is extended or adjusted under 35 U.S.C. 154(b) by 324 days.

(21) Appl. No.: 18/012,685

(22) PCT Filed: May 28, 2021

(86) PCT No.: PCT/KR2021/006652
§ 371 (c)(1),
(2) Date: Dec. 23, 2022

(87) PCT Pub. No.: WO2022/005025
PCT Pub. Date: Jan. 6, 2022

(65) Prior Publication Data
US 2023/0260806 A1    Aug. 17, 2023

(30) Foreign Application Priority Data
Jun. 30, 2020 (KR) .......... 10-2020-0080110

(51) Int. Cl.
*H01L 21/67* (2006.01)
(52) U.S. Cl.
CPC .. *H01L 21/67028* (2013.01); *H01L 21/67034* (2013.01); *H01L 21/67178* (2013.01); *H01L 21/67* (2013.01); *H01L 21/6719* (2013.01); *H01L 21/67253* (2013.01)

(58) Field of Classification Search
CPC ......... H01L 21/67034; H01L 21/67028; H01L 21/67178
See application file for complete search history.

(56) References Cited

U.S. PATENT DOCUMENTS

| | | | |
|---|---|---|---|
| 2003/0191551 A1* | 10/2003 | Gotoh | H01L 21/6838 700/121 |
| 2004/0040659 A1* | 3/2004 | Hasper | H01L 21/67161 156/345.32 |
| 2017/0345680 A1* | 11/2017 | Lee | H01L 21/67023 |
| 2017/0345688 A1 | 11/2017 | Lee | |
| 2019/0206702 A1* | 7/2019 | Gosho | H01L 21/67028 |

FOREIGN PATENT DOCUMENTS

| | | |
|---|---|---|
| JP | 2003297901 A | 10/2003 |
| KR | 20040063301 A | 7/2004 |
| KR | 20090050319 A | 5/2009 |
| KR | 20130037362 A | 4/2013 |
| KR | 20170134091 A | 12/2017 |

* cited by examiner

*Primary Examiner* — Michael E Barr
*Assistant Examiner* — Kevin G Lee
(74) *Attorney, Agent, or Firm* — KDW Firm PLLC

(57) ABSTRACT

A substrate processing system, according to one embodiment, comprises: a cleaning device, positioned at a first position, for performing a cleaning process for a substrate; a drying device, positioned at a second position, for performing a drying process for the substrate; and a transfer unit for transferring the substrate from the cleaning device to the drying device, wherein the first position and the second position may be vertically arranged.

9 Claims, 6 Drawing Sheets

SUBSTRATE PROCESSING SYSTEM WITH VERTICAL ARRANGEMENT STRUCTURE

CROSS-REFERENCE TO RELATED APPLICATIONS

This application is a national phase entry of, claims the benefit of and priority to previously filed International Patent Application No. PCT/KR2021/006652, entitled 'SUBSTRATE PROCESSING SYSTEM WITH VERTICAL ARRANGEMENT STRUCTURE", filed May 28, 2021, which claims priority to Korean Patent Application No. 10-2020-0080110, filed Jun. 30, 2020, which are hereby incorporated by reference in their entireties.

TECHNICAL FIELD

The following embodiments relate to a substrate processing system with a vertical arrangement structure.

BACKGROUND ART

In general, semiconductors are manufactured by repeatedly performing a series of processes such as lithography, deposition, and etching. Contaminants such as various particles, metal impurities, or organic materials remain on a surface of a substrate constituting a semiconductor by repeated processes. Due to such contaminants remaining on the substrate, the reliability of the semiconductor may decrease. To remove the contaminants, a process of cleaning and drying a substrate in a manufacturing process of a semiconductor is required.

A cleaning device and a drying device are conventionally in a horizontal arrangement. Thus, while a substrate is moved in a horizontal direction in the process of transferring the substrate from the cleaning device to the drying device, a cleaning solution on the substrate drifts to one side, resulting in a loss of the cleaning solution. In addition, a weight measuring device is conventionally provided in a transfer unit that transfers a substrate, and thus, an issue of poor accuracy in weight measurement due to shaking during transfer arises. Therefore, a substrate processing system that may minimize the drift of a cleaning solution and the resulting loss of the cleaning solution while a substrate is transferred from a cleaning device to a drying device is needed. Further, a substrate processing system including a transfer unit and a weight measurement unit as separate elements to accurately measure the weight of a substrate is needed.

The above description is information the inventor(s) acquired during the course of conceiving the present disclosure, or already possessed at the time, and is not necessarily art publicly known before the present application was filed.

DISCLOSURE OF THE INVENTION

Technical Goals

An embodiment is directed to providing a substrate processing system that may prevent a cleaning solution from spilling onto a substrate and minimize the loss of the cleaning solution in a process of transferring the substrate from a cleaning device to a drying device.

An embodiment is directed to providing a substrate processing system including a transfer unit and a weight measurement unit configured separately to increase the accuracy of weight measurement.

Technical Solutions

According to an embodiment, a substrate processing system includes a cleaning device, positioned at a first position, for performing a cleaning process for a substrate, a drying device, positioned at a second position, for performing a drying process for the substrate, and a transfer unit for transferring the substrate from the cleaning device to the drying device, wherein the first position and the second position may be vertically arranged.

The first position may be higher than the second position.

The substrate processing system may further include a weight measurement unit for primarily measuring the weight of the substrate at the first position after the cleaning process is completed and secondarily measuring the weight of the substrate at the second position after the substrate is transferred to the second position.

The weight measurement unit may include a first weight measuring device positioned at the first position, and a second weight measuring device positioned at the second position.

The weight measurement unit may further include a hinge driving unit for driving by a hinge the first weight measuring device to be in a vertical direction from a horizontal direction.

When the cleaning process is completed, the transfer unit may transfer the substrate from the cleaning device to the first weight measuring device, and when the primary weight measurement is completed by the first weight measuring device, the hinge driving unit may drive by the hinge the first weight measuring device from the horizontal direction to the vertical direction.

When the first weight measuring device is driven by the hinge to be in the vertical direction, the transfer unit may transfer the substrate from the first position to the second weight measuring device, and when the secondary weight measurement is completed by the second weight measuring device, the transfer unit may transfer the substrate from the second weight measuring device to the drying device.

The weight measurement unit may further include a weight measuring device for measuring the weight of the substrate, a rail connecting the first position and the second position, and a driving unit for moving the weight measuring device along the rail.

When the cleaning process is completed, the transfer unit may transfer the substrate from the cleaning device to the weight measuring device positioned at the first position, and when the primary weight measurement is completed by the weight measuring device, the driving unit may move the weight measuring device from the first position to the second position.

When the weight measuring device is moved to the second position, the transfer unit may transfer the substrate from the first position to the weight measuring device positioned at the second position, and when the secondary weight measurement is completed by the weight measuring device, the transfer unit may transfer the substrate from the weight measuring device to the drying device.

The substrate processing system may further include a controller for adjusting a transfer speed of the transfer unit through a comparison between the weight by the primary weight measurement and the weight by the secondary weight measurement.

The weight measurement unit may further include a first weight measurement unit and a second weight measurement unit installed in the cleaning device and the drying device, respectively, wherein the first weight measurement unit and the second weight measurement unit may respectively include tunnel portions respectively provided at openings of the cleaning device and the drying device, load cells provided in upper portions of the tunnel portions, and substrate seating portions provided inside of the tunnel portions.

When the cleaning process is completed, the transfer unit may transfer the substrate from the cleaning device to the substrate seating portion of the first weight measurement unit, and when the primary weight measurement is completed by the load cell of the first weight measurement unit, the transfer unit may transfer the substrate from the substrate seating portion of the first weight measurement unit to the substrate seating portion of the second weight measurement unit.

When the secondary weight measurement is completed by the load cell of the second weight measurement unit, the transfer unit may transfer the substrate from the substrate seating portion of the second weight measurement unit to the drying device.

The substrate processing system may further include a controller for adjusting a transfer speed of the transfer unit through a comparison between the weight by the primary weight measurement and the weight by the secondary weight measurement.

Effects

A substrate processing system according to an embodiment may include a cleaning device and a drying device arranged in a vertical direction, thereby preventing a cleaning solution from spilling onto a substrate and minimizing the loss of the cleaning solution in a process of transferring the substrate.

A substrate processing system according to an embodiment may include a transfer unit and a weight measurement unit configured separately, thereby increasing the accuracy of weight measurement.

The effects of the substrate processing system are not limited to the above-mentioned effects, and other unmentioned effects can be clearly understood from the above description by those having ordinary skill in the technical field to which the present disclosure pertains.

BEST MODE FOR CARRYING OUT THE INVENTION

Figure 1:
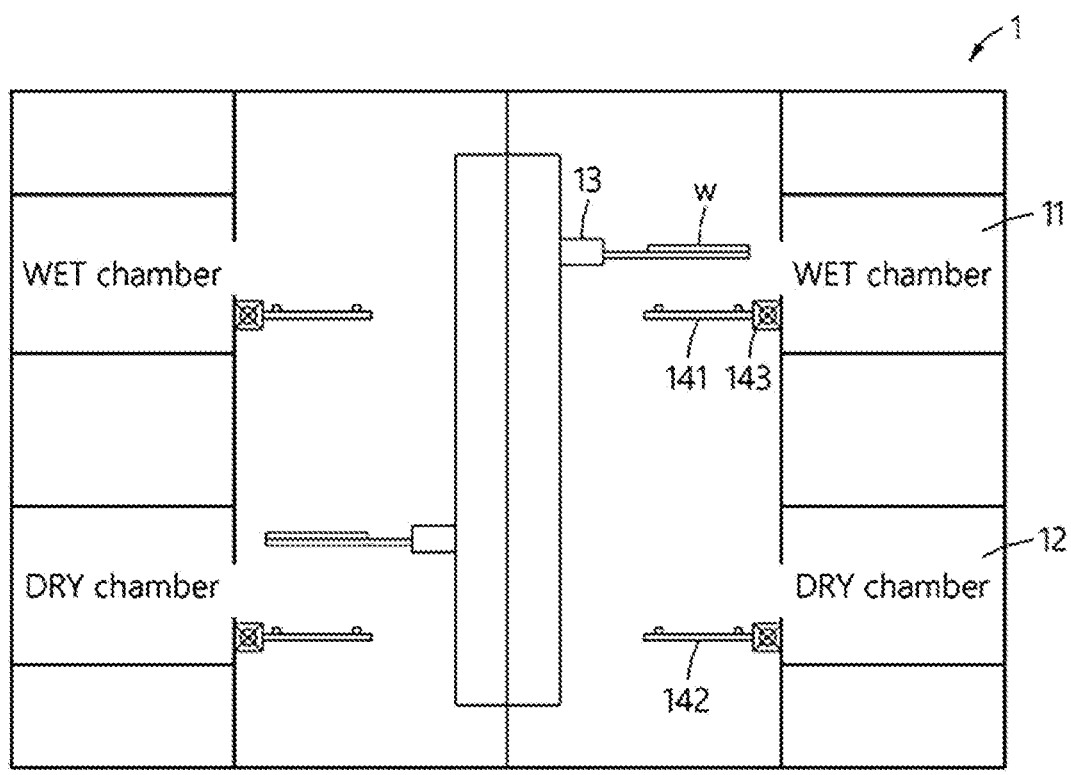
FIGS. 1 and 2 are schematic side views of a substrate processing system according to an embodiment, illustrating a process of transferring a substrate from a cleaning device to a drying device.

Hereinafter, embodiments will be described in detail with reference to the accompanying drawings. However, various alterations and modifications may be made to the embodiments. Here, the embodiments are not construed as limited to the disclosure. The embodiments should be understood to include all changes, equivalents, and replacements within the idea and the technical scope of the disclosure.

The terminology used herein is for the purpose of describing particular embodiments only and is not to be limiting of the embodiments. The singular forms "a", "an", and "the" are intended to include the plural forms as well, unless the context clearly indicates otherwise. It will be further understood that the terms "comprises/comprising" and/or "includes/including" when used herein, specify the presence of stated features, integers, steps, operations, elements, and/or components, but do not preclude the presence or addition of one or more other features, integers, steps, operations, elements, components and/or groups thereof.

Unless otherwise defined, all terms including technical and scientific terms used herein have the same meaning as commonly understood by one of ordinary skill in the art to which embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

When describing the embodiments with reference to the accompanying drawings, like reference numerals refer to like constituent elements and a repeated description related thereto will be omitted. In the description of embodiments, detailed description of well-known related structures or functions will be omitted when it is deemed that such description will cause ambiguous interpretation of the present disclosure.

Also, in the description of the components, terms such as first, second, A, B, (a), (b) or the like may be used herein when describing components of the present disclosure. These terms are used only for the purpose of discriminating one constituent element from another constituent element, and the nature, the sequences, or the orders of the constituent elements are not limited by the terms. When one constituent element is described as being "connected", "coupled", or "attached" to another constituent element, it should be understood that one constituent element can be connected or attached directly to another constituent element, and an intervening constituent element can also be "connected", "coupled", or "attached" to the constituent elements.

The same name may be used to describe an element included in the embodiments described above and an element having a common function. Unless otherwise mentioned, the descriptions on the embodiments may be applicable to the following embodiments and thus, duplicated descriptions will be omitted for conciseness.

Figure 2:
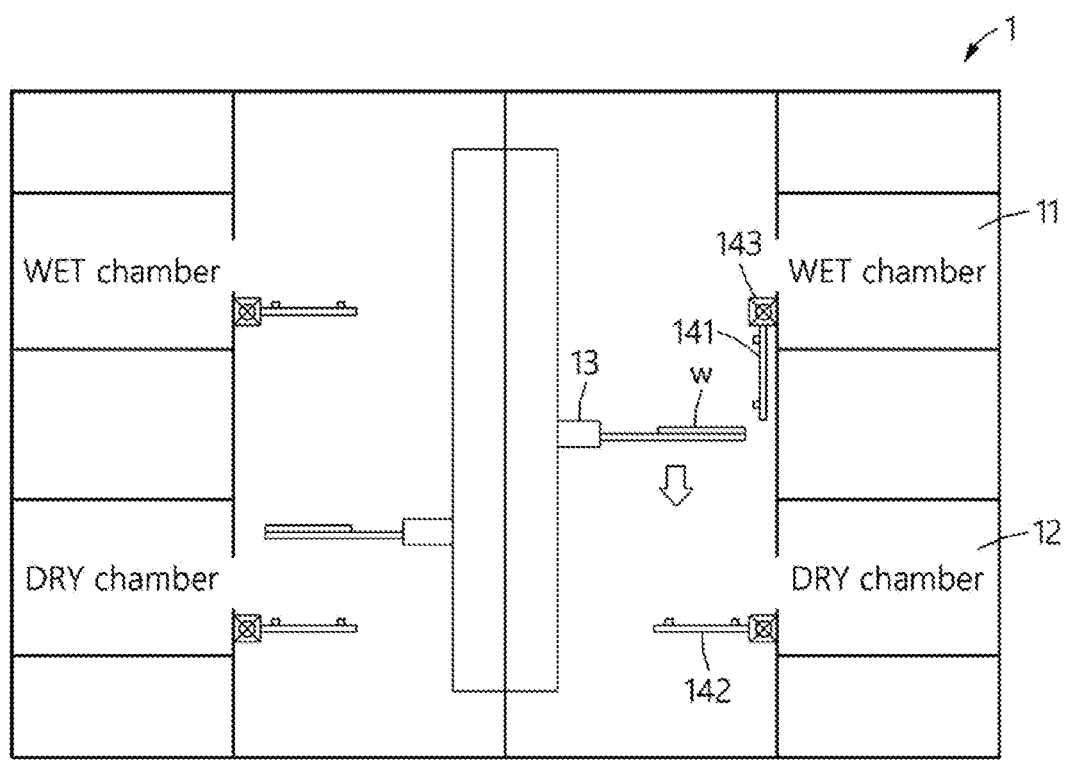

FIGS. 1 and 2 are schematic side views of a substrate processing system according to an embodiment, illustrating a process of transferring a substrate from a cleaning device to a drying device.

Referring to FIGS. 1 and 2, according to an embodiment, a substrate processing system 1 may clean and dry a substrate W. A cleaning solution may be applied to the substrate W as a cleaning process is performed by a cleaning device 11. The substrate W with the cleaning solution applied may be transferred to the drying device 12, and the cleaning solution may be removed as a drying process is performed.

According to an embodiment, the substrate processing system 1 may include the cleaning device 11, the drying device 12, a transfer unit 13, a weight measurement unit 14, and a controller (not shown).

The cleaning device 11 may perform the cleaning process for the substrate W. The cleaning device 11 may include an opening through which the substrate W may enter and exit, and the opening may be open and closed. The cleaning device 11 may be positioned at a first position.

The drying device 12 may perform the drying process for the substrate W. The drying device 12 may include an opening through which the substrate W may enter and exit, and the opening may be open and closed. The drying device 12 may be positioned at a second position.

The first position and the second position may be vertically arranged. In other words, the cleaning device 11 and the drying device 12 may be in a vertical arrangement with respect to each other. The first position may be higher than the second position. That is, the cleaning device 11 may be at a higher position than the drying device 12. Alternatively, the second position may be higher than the first position. In this case, the drying device 12 may be at a higher position than the cleaning device 11.

The transfer unit 13 may transfer the substrate W. The transfer unit 13 may transfer the substrate W between the cleaning device 11 and the drying device 12. That is, the transfer unit 13 may transfer the substrate W from the cleaning device 11 to the drying device 12. In addition, the transfer unit 13 may lead the substrate W into or out of each of the cleaning device 11 and the drying device 12. For example, the transfer unit 13 may include a robot hand and a rail. The robot hand may move in a vertical direction along the rail and transfer the substrate W to the first position and the second position. In the state in which the substrate W is transferred to the first position and the second position, the robot hand may move in a horizontal direction and lead the substrate W into or out of each of the cleaning device 11 and the drying device 12.

The weight measurement unit 14 may measure the weight of the substrate W. In detail, the weight measurement unit 14 may primarily measure the weight of the substrate W at the first position after the cleaning process is completed, and secondarily measure the weight of the substrate W at the second position after the substrate W is transferred to the second position.

According to an embodiment, the weight measurement unit 14 may include a first weight measuring device 141, a second weight measuring device 142, and a hinge driving unit 143.

The first weight measuring device 141 may be positioned at the first position. For example, the first weight measuring device 141 may be at a lower position than the opening of the cleaning device 11 by a predetermined distance. The first weight measuring device 141 may primarily measure the weight of the substrate W after the cleaning process is completed.

The second weight measuring device 142 may be positioned at the second position. For example, the second weight measuring device 142 may be at a lower position than the opening of the drying device 12 by a predetermined distance. The second weight measuring device 142 may secondarily measure the weight of the substrate W transferred to the second position. The second weight measuring device 142 and the first weight measuring device 141 may be set to have the same sensitivity.

The hinge driving unit 143 may drive by a hinge the first weight measuring device 141 to be in a vertical direction from a horizontal direction. For example, the hinge driving unit 143 may change the first weight measuring device 141 disposed in the horizontal direction to be in the vertical direction by rotating the first weight measuring device 141 downward about the hinge.

Hereinafter, the sequence of operation of the substrate processing system 1 will be described.

Referring to FIG. 1, the substrate W may be led into the cleaning device 11 at the first position. The cleaning device 11 may perform the cleaning process for the substrate W. When the cleaning process is completed, the substrate W may be led out of the cleaning device 11 by the transfer unit 13 and lowered to be seated on the first weight measuring device 141. The first weight measuring device 141 may primarily measure the weight of the substrate W. When the primary weight measurement is completed, the substrate W may be slightly raised upward by the transfer unit 13, and the first weight measuring device 141 may be driven by the hinge through the hinge driving unit 143 to be in the vertical direction from the horizontal direction. This configuration may prevent mutual interference between a transfer path along which the transfer unit 13 transfers the substrate W and the first weight measuring device 141. Referring to FIG. 2, the transfer unit 13 may descend to transfer the substrate W from the first position to the second weight measuring device 142, and the substrate W may be seated on the second weight measuring device 142. The second weight measuring device 142 may secondarily measure the weight of the substrate W. When the secondary weight measurement is completed, the substrate W may be slightly raised upward by the transfer unit 13, and may be led into the drying device 12 for the drying process. The drying device 12 may perform the drying process. As described above, by arranging the cleaning device 11 and the drying device 12 in a vertical direction, the substrate W with the cleaning solution applied may be lowered and transferred in the vertical direction. Therefore, the direction in which the substrate W is transferred may coincide with the direction of gravity and descending airflow from above, and thus, the loss of the cleaning solution may be minimized.

The controller may adjust a transfer speed of the transfer unit 13 through a comparison between the weight by the primary weight measurement and the weight by the secondary weight measurement. In detail, the controller may measure the amount of loss of the cleaning solution by comparing the weight by the primary weight measurement and the weight by the secondary weight measurement and adjust the transfer speed of the transfer unit 13 accordingly, thereby optimizing transfer conditions and determining the presence or absence of abnormalities in the process and facility through the detected weight data.

Figure 3:
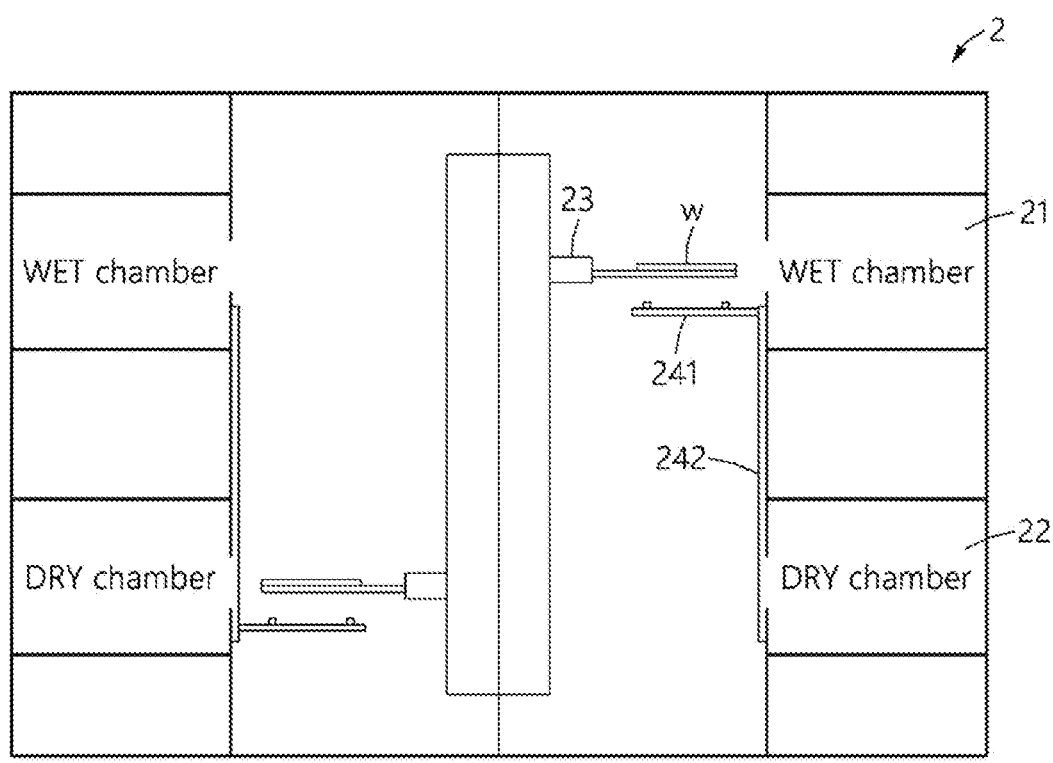
FIG. 3 is a schematic side view of a substrate processing apparatus according to an embodiment.
Figure 4:
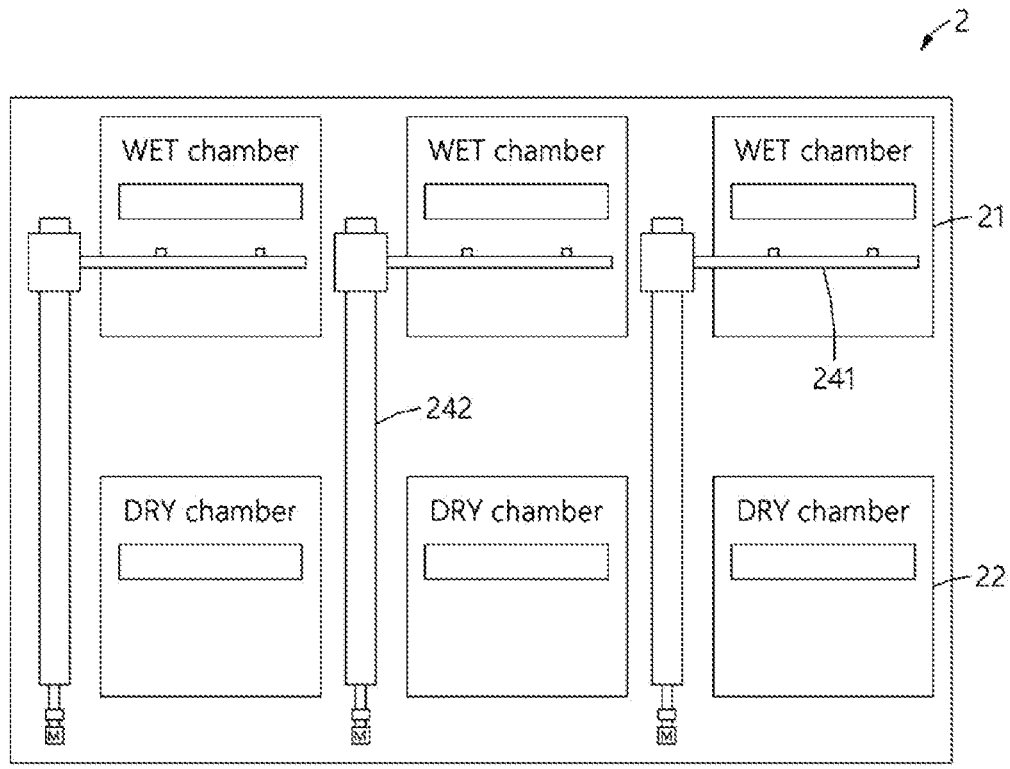
FIG. 4 is a schematic front view of a substrate processing apparatus according to an embodiment.

FIG. 3 is a schematic side view of a substrate processing apparatus according to an embodiment. FIG. 4 is a schematic front view of the substrate processing apparatus according to an embodiment.

Referring to FIGS. 3 and 4, according to an embodiment, a substrate processing system 2 may include a cleaning device 21, a drying device 22, a transfer unit 23, a weight measurement unit 24, and a controller (not shown). The cleaning device 21, the drying device 22, the transfer unit 23, and the controller are the same as the elements described above, and detailed descriptions thereof will be omitted.

The weight measurement unit 24 may measure the weight of a substrate W. In detail, the weight measurement unit 24 may primarily measure the weight of the substrate W at a first position after a cleaning process is completed, and secondarily measure the weight of the substrate W at a second position after the substrate W is transferred to the second position.

According to an embodiment, the weight measurement unit 24 may include a weight measuring device 241, a rail 242, and a driving unit (not shown).

The weight measuring device 241 may measure the weight of the substrate W. The rail 242 may provide a moving path for the weight measuring device 241. The rail 242 may be disposed in a vertical direction to pass through the first position and the second position. The driving unit may move the weight measuring device 241 along the rail 242. Accordingly, the weight measuring device 241 may be moved by the driving unit along the rail 242 in a vertical direction between the first position and the second position.

Hereinafter, the sequence of operation of the substrate processing system 2 will be described.

Referring to FIGS. 3 and 4, the substrate W may be led into the cleaning device at the first position. The cleaning device 21 may perform the cleaning process for the substrate W. At this time, the weight measuring device 241 may be positioned at the first position. For example, the weight measuring device 241 may be at a lower position than an opening of the cleaning device 21 by a predetermined distance. When the cleaning process is completed, the substrate W may be led out of the cleaning device 21 by the transfer unit 23 and lowered to be seated on the weight measuring device 241 positioned at the first position. The weight measuring device 241 may primarily measure the weight of the substrate W. When the primary weight measurement is completed, the substrate W may be slightly raised upward by the transfer unit 23, and the weight measuring device 241 may be lowered to the second position by the driving unit along the rail 242. For example, the weight measuring device 241 may be at a lower position than an opening of the drying device 22 by a predetermined distance. This configuration may prevent mutual interference between a transfer path along which the transfer unit 23 transfers the substrate W and the weight measuring device 241. Thereafter, the transfer unit 23 may descend to transfer the substrate W from the first position to the weight measuring device 241 positioned at the second position, and the substrate W may be seated on the weight measuring device 241 positioned at the second position. The weight measuring device 241 may secondarily measure the weight of the substrate W. When the secondary weight measurement is completed, the substrate W may be slightly raised upward by the transfer unit 23, and may be led into the drying device 22 for a drying process. The drying device 22 may perform the drying process. As described above, by arranging the cleaning device 21 and the drying device 22 in a vertical direction, the substrate W with a cleaning solution applied may be lowered and transferred in the vertical direction. Therefore, the direction in which the substrate W is transferred may coincide with the direction of gravity and descending airflow from above, and thus, the loss of the cleaning solution may be minimized. In addition, according to this structure, the weight measuring device 241 may always be at a lower position than the transfer unit 13 and thus free from interference in its path, and both the primary measurement and the secondary measurement may be performed using a single weight measuring device 241, reducing measurement errors compared to when a plurality of weight measuring devices are used.

Figure 5:
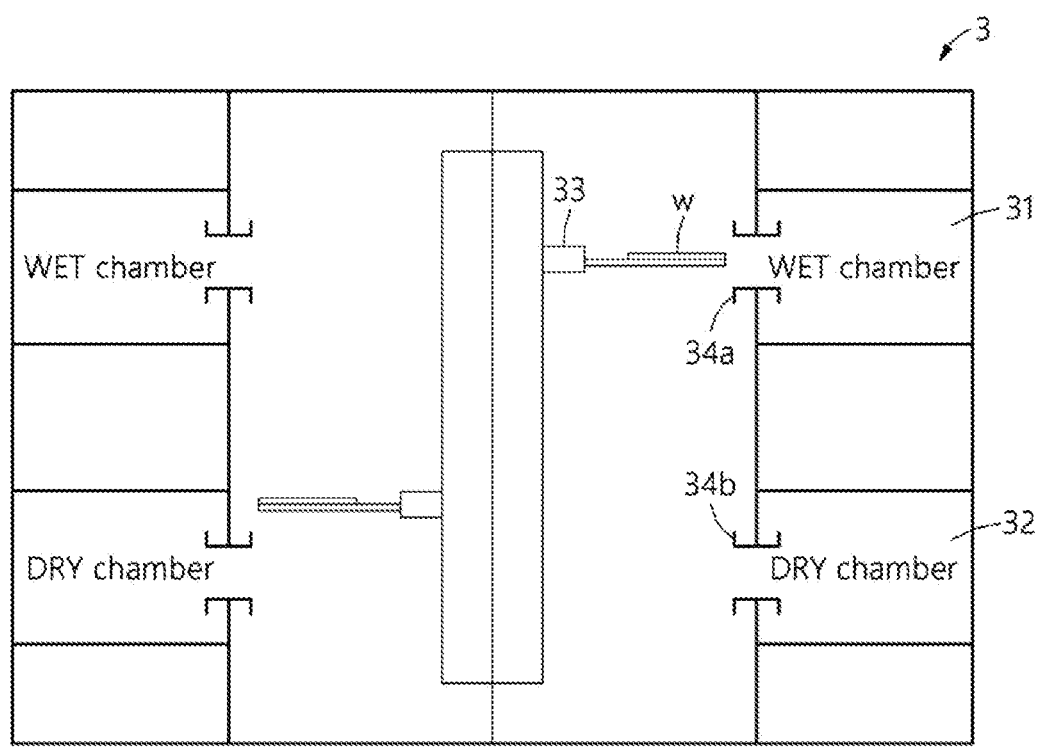
FIG. 5 is a schematic side view of a substrate processing apparatus according to an embodiment.
Figure 6:
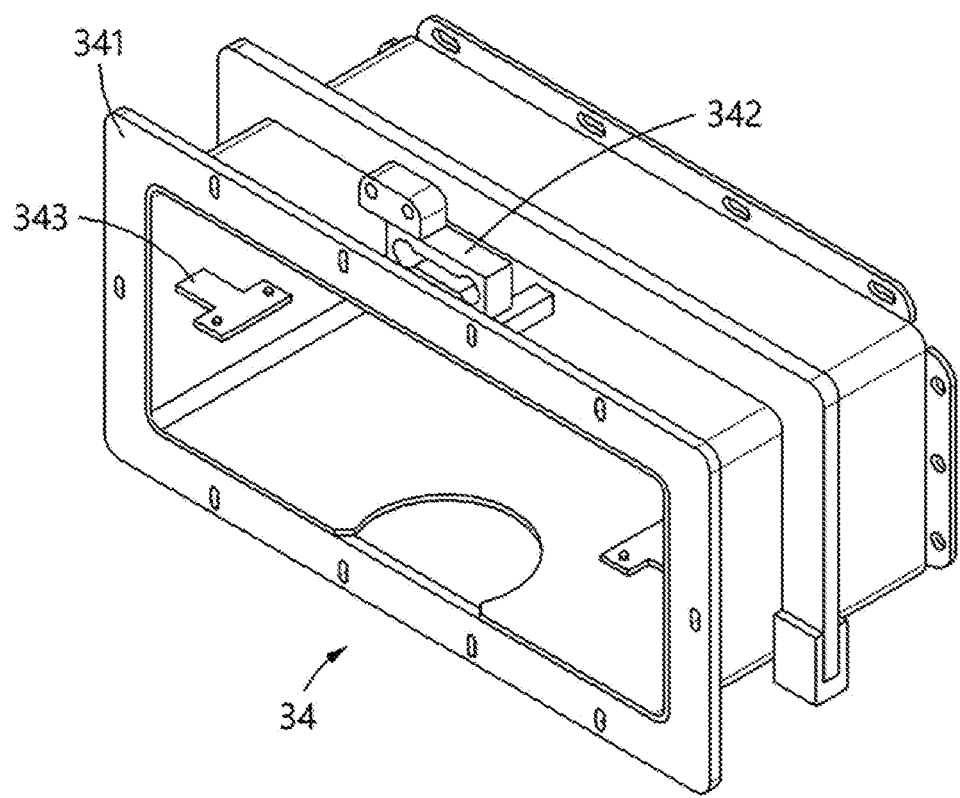
FIG. 6 is a perspective view of a weight measurement unit according to an embodiment.

FIG. 5 is a schematic side view of a substrate processing apparatus according to an embodiment. FIG. 6 is a perspective view of a weight measurement unit according to an embodiment.

Referring to FIGS. 5 and 6, according to an embodiment, a substrate processing system 3 may include a cleaning device 31, a drying device 32, a transfer unit 33, a weight measurement unit 34, and a controller (not shown). The cleaning device 31, the drying device 32, the transfer unit 33, and the controller are the same as the elements described above, and detailed descriptions thereof will be omitted.

The weight measurement unit 34 may measure the weight of a substrate W. In detail, the weight measurement unit 34 may primarily measure the weight of the substrate W at a first position after a cleaning process is completed, and secondarily measure the weight of the substrate W at a second position after the substrate W is transferred to the second position.

According to an embodiment, the weight measurement unit 34 may include a first weight measurement unit 34a and a second weight measurement unit 34b. The first weight measurement unit 34a may be provided in the cleaning device 31. The second weight measurement unit 34b may be provided in the drying device 32.

The first weight measurement unit 34a and the second weight measurement unit 34b may respectively include tunnel portions 341a and 341b, load cells 342a and 342b, and substrate seating portions 343a and 343b.

The tunnel portions 341a and 341b may be respectively provided at openings of the cleaning device 31 and the drying device 32. The tunnel portions 341a and 341b may have a shape surrounding the periphery of the openings. The tunnel portions 341a and 341b may be intended to prevent particles.

The load cells 342a and 342b may be provided in upper portions of the tunnel portions 341a and 341b. The load cells 342a and 342b may connect the upper portions of the tunnel portions 341a and 341b and the openings of the cleaning device 31 and the drying device 32.

The substrate seating portions 343a and 343b may be provided inside of the tunnel portions 341a and 341b. The substrate W may be seated on the substrate seating portions 343a and 343b for weight measurement, and the load cells 342a and 342b may measure the weight of the substrate W through the weight increased before and after the substrate W is seated. This configuration may minimize the space for installation and reduce the transfer time. In addition, the configuration may prevent interference in a transfer path of the transfer unit 33.

Hereinafter, the sequence of operation of the substrate processing system 2 will be described.

Referring to FIGS. 5 and 6, the substrate W may be led into the cleaning device at the first position. The cleaning device 31 may perform a cleaning process for the substrate W. When the cleaning process is completed, the substrate W may be led out of the cleaning device 31 by the transfer unit 33 and lowered to be seated on the substrate seating portion 341a of the first weight measurement unit 34a. The load cell 342a may primarily measure the weight of the substrate W. When the primary weight measurement is completed, the substrate W may be slightly raised upward from the substrate seating portion 341a of the first weight measurement unit 34a by the transfer unit 33, and transferred to the substrate seating portion 341b of the second weight measurement unit 34b. The substrate W may be seated on the substrate seating portion 341b of the second weight measurement unit 34b, and the load cell 342b may secondarily measure the weight of the substrate W. When the secondary weight measurement is completed, the substrate W may be slightly raised upward from the substrate seating portion 341b of the second weight measurement unit 34b by the transfer unit 33, and led into the drying device 32 for a drying process. The drying device 32 may perform the drying process. As described above, by arranging the cleaning device 31 and the drying device 32 in a vertical direction, the substrate W with a cleaning solution applied may be lowered and transferred in the vertical direction. Therefore, the direction in which the substrate W is transferred may coincide with the direction of gravity and descending airflow from above, and thus, the loss of the cleaning solution may be minimized.

A number of embodiments have been described above. Nevertheless, it should be understood that various modifications may be made to these embodiments. For example, suitable results may be achieved if the described techniques are performed in a different order and/or if components in a described system, architecture, device, or circuit are combined in a different manner and/or replaced or supplemented by other components or their equivalents.

Accordingly, other implementations are within the scope of the following claims.

The invention claimed is:

1. A substrate processing system, comprising:
a cleaning device, positioned at a first position, for performing a cleaning process for a substrate;
a drying device, positioned at a second position, for performing a drying process for the substrate; and
a transfer unit for transferring the substrate from the cleaning device to the drying device,
wherein the first position and the second position are vertically arranged,
further comprising:
a weight measurement unit for primarily measuring the weight of the substrate at the first position after the cleaning process is completed and secondarily measuring the weight of the substrate at the second position after the substrate is transferred to the second position,
wherein the weight measurement unit is provided separately from the transfer unit and provided on a path between the first position and the second position,
the weight measurement unit comprises:
a first weight measuring device positioned at the first position; and
a second weight measuring device positioned at the second position,
the weight measurement unit further comprises:
a hinge driving unit for driving the first weight measuring device to be in a vertical direction from a horizontal direction.

2. The substrate processing system of claim 1, wherein the first position is higher than the second position.

3. The substrate processing system of claim 1, wherein when the cleaning process is completed, the transfer unit transfers the substrate from the cleaning device to the first weight measuring device, and
when the primary weight measurement is completed by the first weight measuring device, the hinge driving unit drives the first weight measuring device from the horizontal direction to the vertical direction.

4. The substrate processing system of claim 3, wherein when the first weight measuring device is positioned to be in the vertical direction, the transfer unit transfers the substrate from the first position to the second weight measuring device, and
when the secondary weight measurement is completed by the second weight measuring device, the transfer unit transfers the substrate from the second weight measuring device to the drying device.

5. The substrate processing system of claim 4, further comprising:
a controller for adjusting a transfer speed of the transfer unit through a comparison between the weight by the primary weight measurement and the weight by the secondary weight measurement.

6. A substrate processing system, comprising:
a cleaning device, positioned at a first position, for performing a cleaning process for a substrate;
a drying device, positioned at a second position, for performing a drying process for the substrate; and
a transfer unit for transferring the substrate from the cleaning device to the drying device,
wherein the first position and the second position are vertically arranged,
further comprising:
a weight measurement unit for primarily measuring the weight of the substrate at the first position after the cleaning process is completed and secondarily measuring the weight of the substrate at the second position after the substrate is transferred to the second position,
wherein the weight measurement unit is provided separately from the transfer unit and provided on a path between the first position and the second position,
wherein the weight measurement unit further comprises:
a weight measuring device for measuring the weight of the substrate;
a rail connecting the first position and the second position; and
a driving unit for moving the weight measuring device along the rail.

7. The substrate processing system of claim 6, wherein when the cleaning process is completed, the transfer unit transfers the substrate from the cleaning device to the weight measuring device positioned at the first position, and
when the primary weight measurement is completed by the weight measuring device, the driving unit moves the weight measuring device from the first position to the second position.

8. The substrate processing system of claim 7, wherein when the weight measuring device is moved to the second position, the transfer unit transfers the substrate from the first position to the weight measuring device positioned at the second position, and
when the secondary weight measurement is completed by the weight measuring device, the transfer unit transfers the substrate from the weight measuring device to the drying device.

9. The substrate processing system of claim 8, further comprising:
a controller for adjusting a transfer speed of the transfer unit through a comparison between the weight by the primary weight measurement and the weight by the secondary weight measurement.

* * * * *